United States Patent [19]
Mendez et al.

[11] Patent Number: 5,132,746
[45] Date of Patent: Jul. 21, 1992

[54] BIAXIAL-STRESS BARRIER SHIFTS IN PSEUDOMORPHIC TUNNEL DEVICES

[75] Inventors: Emilio E. Mendez, Croton-on-Hudson; Theoren P. Smith, III, Yorktown Heights; Jerry M. Woodall, Bedford, all of N.Y.

[73] Assignee: International Business Machines Corporation, Armonk, N.Y.

[21] Appl. No.: 637,397

[22] Filed: Jan. 4, 1991

[51] Int. Cl.$^5$ ........................... H01L 29/205
[52] U.S. Cl. ........................... 357/4; 357/16; 357/22; 357/30
[58] Field of Search ................ 357/4, 16, 22, 30

[56] References Cited

U.S. PATENT DOCUMENTS

| | | |
|---|---|---|
| 3,407,343 | 10/1968 | Fang . |
| 3,566,215 | 2/1971 | Heywang . |
| 4,665,415 | 5/1987 | Esaki et al. . |
| 4,695,857 | 9/1987 | Baba et al. . |
| 4,720,309 | 1/1988 | Deveaud et al. . |
| 4,772,924 | 9/1988 | Bean et al. . |
| 4,772,934 | 9/1988 | Cunningham et al. . |
| 4,797,716 | 1/1989 | Chaffin ........................ 357/16 |
| 4,952,792 | 8/1990 | Caridi ........................ 357/4 |

OTHER PUBLICATIONS

Das et al., *Appl. Phys. Lett.* 51 (15) Oct. 12, 1987, pp. 1164–1166, "Performance . . . Photodiodes".
Sweeney, M., et al., "Resonant Interband Tunnel Diodes", *Appl. Phys. Lett.* 54(6):546 (1989).
"Negative Resistance Device", *IBM Technical Disclosure Bulletin*, 31(7):20 (1988).
Baratte, H., "Stain Layer Gated Selective Area Enhancement and Depletion Mode Semiconductor Field–Effect Transistors" *IBM Technical Disclosure Bulletin*, 31(7):17 (1988).
Molecular-Beam Epitaxial Growth and Characterization of Strained GaInAs/AlInAs and InAs/GaAs "Quantum Well Two-Dimensional Electron Gas Field Effect Transistors", Seventh Molecular Beam Epitaxy Workshop, Cambridge, Mass., 20–22 (Oct. 1986).
Gavrilovic, P., et al., "Resonant Tunnelling in a GaAs$_{1-x}$P$_x$GaAs Strained Layer Quantum Well Heterostructure", *Solid State Communications*, 52(3):237 (1984).

*Primary Examiner*—Jerome Jackson, Jr.
*Attorney, Agent, or Firm*—Scully, Scott, Murphy & Presser

[57] ABSTRACT

Resonant tunneling devices having improved peak-to-valley current ratios are disclosed. The resonant tunneling device comprises a quantum well layer surrounded by first and second barrier layers, the first and second barrier layers being comprised of an indirect first III-V compound semiconductor. The first barrier layer being formed on a substrate of a second III-V compound semiconductor having a lattice constant larger than the lattice constant of the first barrier layer thereby inducing a biaxial stress in the first barrier layer. The biaxial stress results in an energy shift at resonance that increases the peak to valley current ratio of the device.

26 Claims, 3 Drawing Sheets

BIAXIAL-STRESS BARRIER SHIFTS IN PSEUDOMORPHIC TUNNEL DEVICES

BACKGROUND OF THE INVENTION

1. Field of the Invention

This invention relates to semiconductor resonant tunneling structures, and more particularly, to a resonant tunneling device which includes an indirect gap barrier layer disposed on a substrate having a different lattice constant than the lattice constant of the barrier layer to thereby create a biaxial tensile stress in the barrier layer which results in an improved peak to valley current ratio.

2. Discussion of the Prior Art

The field of semiconductor fabrication is an important and increasingly complex technology which is absolutely vital to the continued advancement of solid state electronic device technology. The wide range of semiconductors and the various electrical properties associated with each of the semiconductor materials provide circuit designers with much flexibility in designing devices with varying electrical properties.

Until recently it was very unusual for optoelectronic and high-speed solid state devices to be fabricated with heterojunction structures in which the unstrained lattice constants of the different materials were not approximately equal, and in turn equal to a conveniently available substrate. The lattice matching requirement severely limited the material selection to two principal systems; namely, $Al_xGa_{1-x}As$-GaAs grown on GaAs substrates, and InGaAs-InAlAs grown on InP substrates. Unfortunately optimum material parameters for many devices are obtained with material systems or alloy compositions that are not lattice matched to these or other available bulk substrates.

With the advancement of semiconductor technology, convenient and practical methods of fabricating devices with mismatched lattice constants led to various enhanced electrical and mechanical properties of the devices. One such electrical/mechanical effect is that of a biaxial stress created when two semiconductor materials with different lattice constants are adjacent each other. The article "Molecular-Beam Epitaxial Growth and Characterization of Strained GaInAs/AlInAs and InAs/GaAs Quantum Well Two-Dimensional Electron Gas Field-Effect Transistors", Seventh Molecular Beam Epitaxy Workshop, Cambridge, Mass., Oct. 20–22, 1986 teaches defect free strained layer epitaxy to change device characteristics of quantum wells. The increased freedom associated with mismatched lattice constant compositions allows for the optimization of certain properties of the particular structure such as conduction edge discontinuity and the electron effective mass.

U.S. Pat. No. 4,665,415 to Esaki et al. and assigned to the same assignee as the present invention, discloses a FET which has a conduction channel disposed within a layer of material comprising a group III-V compound and having a crystalline lattice structure which is stressed in two dimensions by means of epitaxial growth upon a thicker and rigid supporting layer comprising a different group III-V compound having a larger lattice spacing. The stretching of the layer having the conduction channel shifts the energy levels of holes therein to remove the degenerate state that exists, thereby elevating light holes to an energy level characterized by increased mobility. Basically, a two dimensional stress is utilized to increase hole mobility thereby increasing the horizontal transport of holes which in turn increases hole current.

SUMMARY OF THE INVENTION

The present invent s directed to resonant tunneling devices having improved peak-to-valley ratios. The resonant tunneling device of the present invention comprises first and second pseudomorphic barrier layers of semiconductor material, a quantum well layer of semiconductor material disposed between the first and second barrier layers, and a means adjacent the first and second barrier layers for subjecting the first and second barrier layers to a biaxial tensile stress. The first and second barrier layers are indirect gap materials formed from a first compound semiconductor of group III and group V elements. The quantum well layer is formed from a second compound semiconductor of group III and group V elements. The means adjacent the first barrier layer is a substrate or a buffer layer disposed on a substrate comprised of a third compound semiconductor of group III and group V elements. Frequently, the buffer layer is comprised of the same material as the quantum well layer.

A biaxial tensile stress can be achieved in the first barrier layer by fabricating the device on a substrate which has a lattice constant greater than the lattice constant of the barrier layers. If the barrier layers are sufficiently thin, then their own lattice structure will strain to conform to the lattice structure of the thicker and more rigid substrate. The barrier layers must be sufficiently thin that the growth is pseudomorphic and the stress is uniform. In addition, the barrier layers must be sufficiently thin to retain the strain or stress. If the layer is too thick the strain induced will eventually relax. The thin barrier layers can be grown by any of the standard epitaxial processes such as molecular beam epitaxy.

In resonant tunnel devices, charge carriers must traverse or tunnel through energy barriers in order to create a net current flow. The desired current flow in a semiconductor device is the peak current or resonant current, and the undesired leakage current, which is caused by thermal excitation from the surrounding environment or by an inelastic scattering process in the structure, is the valley current or nonresonant current. The peak-to-valley current ratio at resonance is a valuable figure of merit for tunneling devices. For example, the values of peak tunneling current and valley current determine the magnitude of the negative resistance slope for a tunnel diode. The negative resistance of a tunnel diode can be used in a variety of ways to achieve high performance switching/oscillation, amplification, and other circuit functions.

There are two possible ways in which the peak-to-valley current ratio can be improved; namely, by increasing the peak current or decreasing the valley current. The resonant tunneling device of the present invention improves the peak-to-valley current ratio by lowering the valley current. The valley current or leakage current can be reduced by increasing the potential barriers that the charge carriers must tunnel through. The strain or stress created in the barrier layers causes various electrical and mechanical changes to occur in the particular device. The principal desired electrical effect that is achieved by the stress is a breakage of the degeneracy of equivalent x points in the Brillouin zone.

The splitting of the valley degeneracy causes the potential barrier in two (001) surface axes (x and y) or channels to increase by several meV and causes the effective mass in the remaining axis (z) or channel to increase such that the current flow in all three axes is significantly small.

The resonant tunneling devices of the present invention utilize biaxial stress in the barrier layers to obtain the improvement in the peak-to-valley ratio which, in turn, leads to higher frequency, low leakage microwave oscillators, quantum well photodetectors or other similar devices. The resonant tunneling devices of the invention can be fabricated utilizing well known techniques, to achieve cost effective devices with low level leakage current at room temperature operation.

DETAILED DESCRIPTION OF THE PREFERRED EMBODIMENTS

Figure 1B:
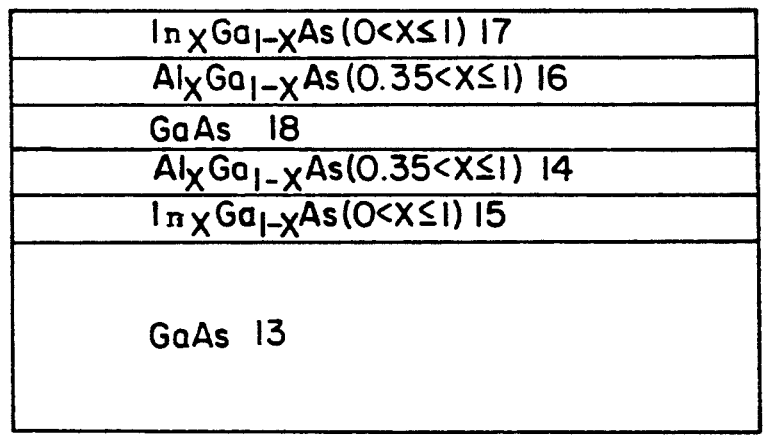
FIGS. 1a and 1b are cross-sectional views of two embodiments of the resonant tunneling device of the present invention.

In accordance with the present invention, resonant tunneling devices and quantum well photodetectors having an improved peak-to-valley current ratio are disclosed. The values of peak tunneling current, $I_p$, and valley current, $I_v$, determine the magnitude of the dynamic or negative resistance of a semiconductor device comprised of a specific material. The higher the negative resistance, the faster the response of the particular device For example, where the device is to be utilized as a solid state microwave generator, an increase in negative resistance permits higher frequencies to be generated by the device. Where the device is to be utilized as a photodetector, an increase in negative resistance results in an increase in the sensitivity of the detector. Therefore, the peak-to-valley current ratio provides an important figure of merit for such resonant tunneling semiconductor devices.

The peak-to-valley current ratio can be improved in one of two ways; namely, by increasing the peak current or decreasing the valley current. The resonant tunneling devices and quantum well photodetectors of the present invention utilize biaxial stress barrier shifts in the barrier layers of the particular device to decrease the valley current or leakage current when the device is being utilized in a room temperature environment.

The valley or leakage current in semiconductor devices is dominated at room temperature by the flow of charge carriers induced into motion by thermal excitation from the surrounding environment, and to a lesser extent by temperature-independent, non-resonant tunneling through the potential barriers Since a majority of semiconductor devices are utilized at or near room temperature, there will typically be a non-negligible leakage current. In order to reduce the leakage current and thereby improve the operation and efficiency of the device, the energy or the height of the barrier that the charge carrier traverses, or more appropriately tunnels through, must be increased to a level greater than the energy supplied to the charge carriers by thermal excitation. Often, to raise the barrier height, one must utilize indirect-gap semiconductors such as AlAs. These materials have a drawback; namely, that an additional "indirect" barrier for charge carriers to tunnel through is relatively low. However, the probability of a carrier to take this indirect channel or path is low since in this case the charge carrier must undergo a change in momentum. It is important to note that no matter how high the energy barrier is, or how much of the change of momentum the charge carriers must go through, charge carriers will to some extent always traverse or tunnel through the potential barrier.

The key to improvement of the peak-to-valley current ratio of a resonant tunneling process is the reduction of the leakage or nonresonant current. When the barriers are "indirect", the splitting by a biaxial tensile stress of the valley degeneracy in the equivalent points of the Brillouin zone (X for AlAs) that give rise to the indirect barrier achieves the improved peak to valley current ratio. The Brillouin zone, as is known in the art, simply defines the velocity of the momentum in space. The higher the strain induced in the barrier layer, the lower the leakage or nonresonant current.

Figure 1A:
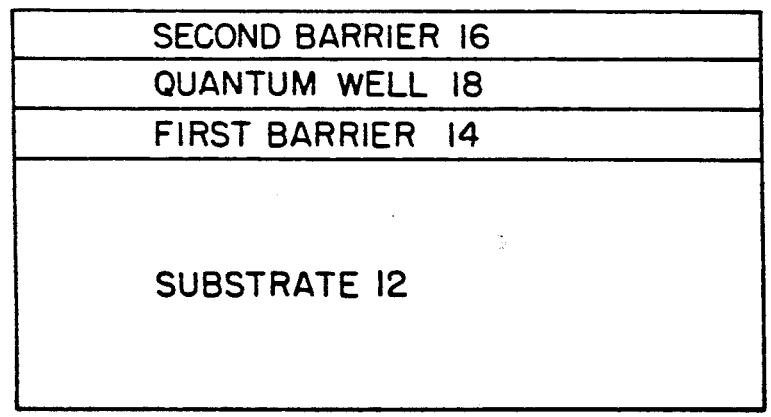

Referring now to FIG. 1a, there is shown a cross-sectional view of the resonant tunneling device 10. The basic resonant tunneling device 10 comprises a substrate layer 12, first and second barrier layers 14 and 16, and a quantum well layer 18. As is stated above, the key to improvement of the peak-to-valley current ratio is causing a splitting of the valley degeneracy by a biaxial tensile stress in the first and second barrier layers 14 and 16 of the device 10. A biaxial tensile stress can be achieved in the barrier layers 14 and 16 by fabricating the device 10 utilizing a substrate comprised of a semiconductor compound having a lattice constant greater than the lattice constant of the semiconductor compound which comprises the first and second barrier layers 14 and 16. The lattice constant or lattice spacing is the distance between an atom and its closest equivalent neighbor in the unit cell. The structure of the lattice determines not only the mechanical properties of the crystalline solid, but also its electrical properties. The first and second barrier layers 14 and 16 comprise indirect band gap semiconductor compounds.

The first and second barrier layers 14 and 16 should be sufficiently thin so that their growth is pseudomorphic (no dislocations formed) and the stress induced is essentially uniform. The thin first and second barrier layers 14 and 16 are, for example epitaxially grown on a relatively thick and rigid substrate layer 12 of semiconductor material having a crystalline lattice structure which differs from that of the material of the thin first and second barrier layers 14 and 16 in that the lattice spacing of the thick and rigid substrate layer 12 is larger than the lattice spacing of the thin barrier layers 14 and 16. The epitaxial thin first barrier layer 14 which is adjacent the substrate layer 12 is sufficiently thin such that the first barrier layer 14 is strained to conform with the lattice spacing of the rigid and thick substrate layer 12. Typically, the barrier layers 14 and 16 are less than 100 angstroms thick, while the substrate is at least 1 micron thick. The stress or strain in the first barrier layer 14 is manifested as a two-dimensional stretching of the first barrier layer 14 along an interface with the rigid and thick substrate layer 12. If the first barrier layer 14 is grown too thick, then the stresses generated would eventually be relaxed and the crystalline structure would gain its normal state and lattice spacing. The first and second barrier layers 14 and 16 can be grown using any standard epitaxial growth method such as molecular beam epitaxy, MBE.

By appropriate choice of substrate and barrier materials, a fairly large biaxial tensile stress, greater than $10^{10}$ dynes/cm$^2$, will be induced in the first and second barrier layers 14 and 16 causing, at resonance, a shift in potential barrier energy of several meV. This shift in energy results in a proportional increase in the peak to valley ratio of the resonant tunneling device, as will be more fully described hereinafter. A typical structure would be a heterojunction device made of indirect band gap semiconductor materials acting as potential barriers and comprised of compounds formed from group III and group V elements of the periodic table. The most common epitaxial semiconductor system to which this applies is one in which the substrate layer 12 would comprise InGaAs, the barrier layers 14 and 16 would comprise AlGaAs, and the quantum well layer 18 would comprise GaAs. The lattice constant of InAs, which is part of the substrate layer 12 composition, is six percent larger than the lattice constant of AlAs, thus devices grown on an InGaAs substrate and comprising AlGaAs barriers would exhibit this stress and energy shifting phenomenon.

The substrate may also be formed of a bulk substrate 13 of GaAs and a thick buffer layer 15 of $In_xGa_{1-x}As$ ($0<x<1$) grown on the GaAs bulk substrate as shown in FIG. 1b. The resonant tunneling device of the invention may further include an electrode comprised of the same semiconductor material of the substrate 12, or buffer layer 15, which in this embodiment is $In_xGa_{1-x}As$ ($0<x<1$). Typically, the electrode would be heavily doped to provide carriers. In this embodiment, the electrode would be heavily doped with n-type material. The first and second barrier layers 14 and 16 and the quantum well layer 18 have approximately the same lattice spacing. The biaxial stress induced in the first and second barrier layers 14 and 16 is due to the lattice spacing of the $In_xGa_{1-x}As$ ($0<x<1$) utilized in the buffer layer 15 and electrode 17.

Semiconductor materials, as stated previously, are either direct band gap materials or indirect band gap materials. In a heterostructure comprising two direct gap materials, a charge carrier tunnels from the small band gap material through to the large band gap material. The band gap or potential barrier that the charge carrier traverses or tunnels through in a direct gap material is typically called the gamma barrier because it is associated with the gamma (zero momentum) point of the Brillouin zone. In an indirect band gap material, the charge carrier must undergo a change in momentum as well as a change in energy in order to traverse or tunnel through the band gap or potential barrier. The potential barrier that the charge carrier traverses or tunnels through in an indirect gap material is typically called the X point barrier because it is associated with the X point of the Brillouin zone. Every semiconductor material has both types of states present; however, in a direct gap semiconductor, the gamma state is lower in energy and therefore, the leakage or valley current is controlled by this barrier. In an indirect gap semiconductor, such as the compound which comprises the first and second barrier layers 14 and 16 of the present invention, the X point state is the lower barrier and therefore, the leakage or valley current is controlled by this barrier.

Figure 2:
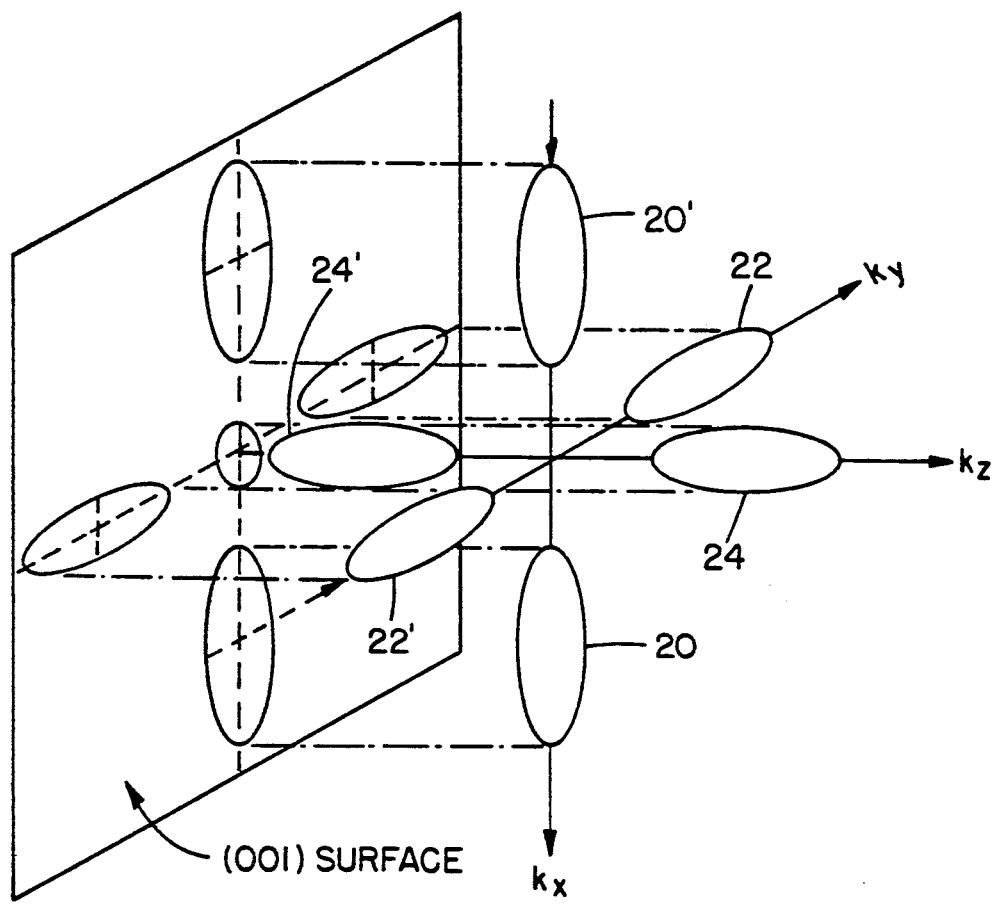
FIG. 2 is a diagram of the conduction-band ellipsoids of minimum energy of the barrier layer of the resonant tunneling device of the present invention.

Referring now to FIG. 2, there is shown a diagram representative of the band structure for the indirect gap III-V compound semiconductor materials disclosed herein. The diagram depicts ellipsoids of minimum conduction-band energy with the conduction band minima at the X point. FIG. 2 illustrates the three possible ellipsoids of minimum conduction band energy present in the semiconductor material which comprises the first and second barrier layers 14 and 16 of the device 10. The three ellipsoids, one for each axis x, y, and z representing three dimensional space, are shown as positive and negative halves, thus the x axis ellipsoid is comprised of ellipsoid halves 20 and 20', the y axis ellipsoid is comprised of ellipsoid halves 22 and 22', and the z axis ellipsoid is comprised of ellipsoid halves 24 and 24'.

The ellipsoids of minimum energy shown in FIG. 2 represent points in space where electrons that occupy the conduction band of the barrier layers 14 and 16, have equal energies or velocities. FIG. 2 represents first barrier layer 14 prior to being subjected to the biaxial stress and thus since all ellipsoids are of equal energy, the ellipsoids are said to exist in a degenerate state.

When two atoms are completely isolated from each other there is no interaction of electron wave functions and they can have identical electronic structures. As the spacing becomes smaller, the wave functions begin to overlap; however, the exclusion principle dictates that no two electrons in a given system may be in the same quantum state, therefore, there must be a splitting of the discrete energy levels of the isolated atoms into new levels belonging to the pair. In solid materials, the split energy levels form essentially continuous bands of energy, the conduction band and the valence band. A state of degeneracy exists when the bands overlap. For an n type semiconductor, the Fermi level goes into the conduction band, and for a p type semiconductor, the Fermi level goes into the valence band. Basically, no two electrons can exist in the same state, but a degenerate semiconductor can have two states of electrons having the same energy.

As was stated previously, the first barrier layer 14 which is adjacent the substrate layer 12, is subjected to a biaxial tensile stress and this stress, either internal or external, causes certain mechanical and electrical properties of the material or compound which comprises the first barrier layer 14 to change. If the biaxial stress is in the x-y plane, then the x ellipsoid and the y ellipsoid will be strained equally in both the x and y directions. In other words, as they are stressed in both the x and y directions, the total energy they represent remains the same with respect to each other, but has increased overall. Basically, both the x and y ellipsoids are still in a degenerate state with respect to each other; however, each of their energy levels has increased. The z ellipsoid however, which is not directly subject to a stress in the x-y plane is forced to a lower energy level then it occupied before and thus the overall degeneracy that had existed between the three ellipsoids is broken.

Recalling that the peak-to-valley current ratio can be increased by decreasing the valley or leakage current and that the X point barriers in an indirect gap semiconductor control this leakage current, it is seen that by increasing the energy levels of the x and y ellipsoids, the leakage current in these directions or channels is reduced. The leakage current is reduced because the electrons have a higher barrier energy to traverse or tunnel through. However, the z ellipsoid has moved to a lower energy, and thus electrons could traverse or tunnel through in this channel and tend to increase the leakage current. This would be true except that the effective mass of the electrons must be taken into account. The effective mass of the electrons is lower on the minor axis and larger on the major axis, thus the effective mass in the z direction is small on the x and y ellipsoids and the effective mass in the z direction is large in the z ellipsoid. Therefore, the biaxial tensile stress has caused the x and y ellipsoids to move to a higher energy level thereby tending to reduce the leakage current in the x and y channels and caused the effective mass in the z direction, as governed by the z ellipsoid, to increase and thus the electrons traversing or tunneling through the barrier will be reduced.

The fact that the valley degeneracy of the conduction band is broken by a biaxial stress is particularly important in devices which rely on tunneling through indirect gap barrier materials such as AlAs or barriers where the direct and indirect band gaps are approximately equal. In tunneling into direct gap or gamma states the resonant or elastic contribution to the tunneling current is determined by the energy of the direct or gamma barrier. On the other hand, the nonresonant or inelastic current flow occurs primarily through the indirect gap ellipsoids with their long or major axes in the x and y direction. The nonresonant current flow through the ellipsoids with their long axis in the z direction is much smaller than the nonresonant current flow through the other ellipsoids because the effective mass in the z direction, the direction of current flow, is about six times larger than the mass in the z direction then in the other ellipsoids. As stated previously, the key to improvement of the peak to valley current ratio of a resonant tunneling process is the reduction of the inelastic or nonresonant current. The splitting of the valley degeneracy by a biaxial tensile stress achieves a reduction. Because the valleys with their long axes in the x and y direction move higher in energy, the tunnel barrier for inelastic current flow becomes larger and the current is reduced. Although the ellipsoids with their long axes in the z direction move lower in energy, the effective mass is so large that the current flow via this channel remains negligibly small. The net result is an improvement in the peak-to-valley ratio of the device.

The above theory and description of how the resonant tunneling device operates is also true for quantum well photodetectors which rely on the resonant tunneling process to improve their sensitivity. In quantum well photodetectors, the desired photocurrent corresponds to the resonant current and the undesirable dark currents arise from the inelastic or nonresonant process. Therefore, by growing the quantum wells and barriers, typically GaAs and AlGaAs respectfully, on an InGaAs substrate, the tensile stress would again reduce the dark current and improve the sensitivity.

Although the best resonant tunneling devices and photodetectors presently comprise AlGaAs barriers, it is possible that AlAs may prove to be a superior barrier material for some applications. In this case the existence of a biaxial tensile stress will have an even more pronounced effect. If, for example, the resonance occurs via an indirect state in the AlAs and only a single barrier is used then there are no gamma states, and the resonant current flows through the ellipsoids with their long axes in the z direction. The nonresonant current flows via the ellipsoids with their long axes perpendicular to the z direction. Thus the biaxial stress raises the energy required for nonresonant tunneling and lowers the energy required for resonant processes. Again, the end result is an improvement in the peak-to-valley ratio of the device.

Figure 3:
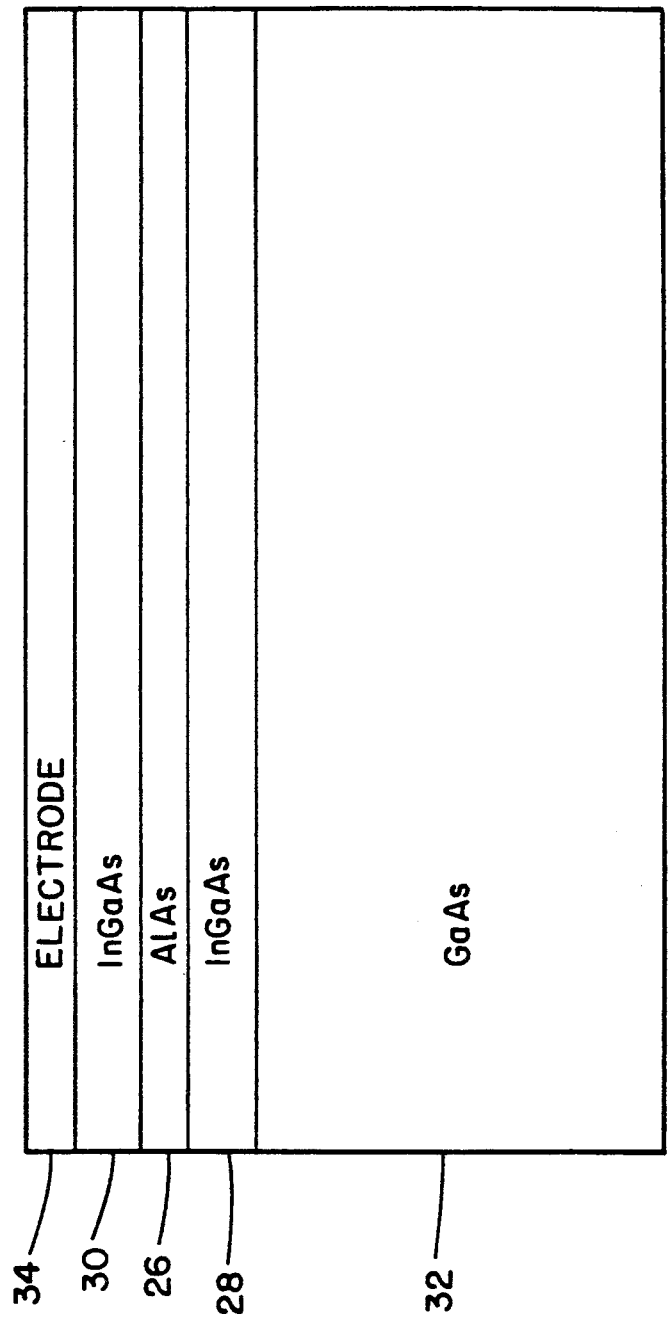
FIG. 3 is a cross-sectional view of a third embodiment of the resonant tunneling device of the present invention.

FIG. 3 illustrates a device utilizing the above described AlAs barrier layer. The device of FIG. 3 comprises a first layer 26 of a first compound semiconductor of Group III-V elements sandwiched between a second layer 28 and a third layer 30 of a second compound semiconductor of Group III-V elements. As before, the device is fabricated on a substrate or buffer layer 32 of a third Group III-V compound semiconductor and has an electrode 34 of a third Group III-V compound semiconductor. In one specific embodiment, the first layer 26 comprises AlAs, the second and third layers 28 and 30 comprise InGaAs, and the substrate 32 comprises GaAs. The first layer 26 being comprised of AlAs has an indirect band gap and a lattice constant different from the lattice constant of the second and third layers 28 and 30 as well as the substrate layer 32; therefore, as previously described, a biaxial stress is induced in this first layer. The first layer 26 acts as a barrier to the flow of charge carriers for non-resonant gamma states. In addition, for resonant X-point states the first layer 26 acts as a quantum well and the second and third layers 28 and 30 act as barriers to the flow of charge carriers.

While the invention has been particularly shown and described with respect to preferred embodiments thereof, it will be understood by those skilled in the art that the foregoing and other changes in form and details may be made therein without departing from the spirit and scope of the invention, which should be limited only by the scope of the appended claims.

Having thus described our invention, what we claim as new, and desire to secure by Letters Patent, is:

1. A resonant tunneling device comprising:
   (a) first and second barrier layers of semiconductor material, said semiconductor material of said barrier layers having an indirect band gap and comprising a first III-V compound semiconductor; and
   (b) a quantum well layer of semiconductor material disposed between said first and second barrier layers, said semiconductor material of said quantum well comprising a second III-V compound semiconductor; and
   (c) means adjacent said first and second barrier layers for subjecting said first and second barrier layers to biaxial tensile stress.

2. The resonant tunneling device according to claim 1, wherein said means adjacent said first barrier layer comprises a semiconductor material having a first lattice constant, said first and second barrier layers having a second lattice constant, said first and second lattice constants being different from each other thereby inducing said biaxial stress in said first layer.

3. The resonant tunneling device according to claim 2, wherein said first lattice constant is larger than said second lattice constant, such that a band edge energy shift will occur thereby correspondingly increasing the peak to valley current ratio of said device.

4. The resonant tunneling device according to claim 3 wherein said first and second barrier layers are pseudomorphic with respect to said means adjacent said first and second barrier layers.

5. The resonant tunneling device according to claim 3 wherein said semiconductor material of said means adjacent the first barrier layer comprises a third III-V compound semiconductor.

6. The resonant tunneling device according to claim 5 wherein said third III-V compound semiconductor is the same compound as said second III-V compound.

7. The resonant tunneling device according to claim 5 wherein said means adjacent said first barrier layer is a substrate of said device.

8. The resonant tunneling device according to claim 5 wherein said means adjacent said first barrier layer is a thick buffer layer disposed on a substrate.

9. The resonant tunneling device according to claim 5, wherein said means adjacent said first barrier layer comprises a layer of said semiconductor material of said first lattice constant at least an order or magnitude greater in thickness than the thickness of said first and second barrier layers, said first and second barrier layers being sufficiently thin to retain the biaxial stress induced by the difference between said first and second lattice constants.

10. The resonant tunneling device according to claim 9, wherein said means adjacent said first barrier layer is typically at least 1 micron thick.

11. The resonant tunneling device according to claim 10, wherein said first and second barrier layers are less than 100 angstroms thick.

12. The resonant tunneling device according to claim 5, wherein said third III-V compound semiconductor is comprised of $In_xGa_{1-x}As$ ($0<x<1$).

13. The resonant tunneling device according to claim 12, wherein said first and second barrier layers are comprised of $Al_xGa_{1-x}As$ ($0.35<x<1$).

14. The resonant tunneling device according to claim 13, wherein said quantum well layer is comprised of GaAs.

15. The resonant tunneling device according to claim 13, wherein said quantum well layer is comprised of $In_xGa_{1-x}As$ ($0<x<1$).

16. The resonant tunneling device according to claim 5, further including an electrode disposed adjacent said second barrier layer.

17. The resonant tunneling device of claim 16 wherein said electrode comprises a semiconductor material of said third III-V compound semiconductor.

18. The resonant tunneling device of claim 17 wherein said electrode further comprises heavily doped n-type material.

19. The resonant tunneling device according to claim 17, wherein said device is a quantum-well photodetector.

20. The resonant tunneling device of claim 17, wherein said device is a high frequency oscillator.

21. A second resonant tunneling device comprising:
a first layer of semiconductor material comprising a first III-V compound semiconductor sandwiched between a second and a third layer of semiconductor material, said second and third layers each comprising a second III-V compound semiconductor, said first layer having an indirect band gap and a lattice constant different than the lattice constant of said second and third layers thereby inducing a biaxial stress in said first layer, said first layer acting as a barrier to the flow of charge carriers for non-resonant gamma states, and said first layer acting as a quantum well and said second and third layers acting as barriers to the flow of charge carriers for resonant X-point states.

22. The resonant tunneling device according to claim 21, wherein said first lattice constant is larger than said second lattice constant, such that at resonance, a band edge energy shift will occur thereby proportionally increasing the peak to valley current ratio of said device.

23. The resonant tunneling device according to claim 22 wherein said first layer is pseudomorphic.

24. The resonant tunneling device according to claim 23 wherein said first layer is AlAs.

25. The resonant tunneling device according to claim 24 wherein said second and third layers are InGaAs.

26. The resonant tunneling device according to claim 24 wherein said second and third layers are InAs.

* * * * *